US009112130B2

(12) United States Patent
Obradovic et al.

(10) Patent No.: US 9,112,130 B2
(45) Date of Patent: Aug. 18, 2015

(54) QUANTUM INTERFERENCE BASED LOGIC DEVICES INCLUDING ELECTRON MONOCHROMATOR

(71) Applicant: Samsung Electronics Co., Ltd., Suwon-si (KR)

(72) Inventors: Borna J. Obradovic, Leander, TX (US); Robert C. Bowen, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/478,344

(22) Filed: Sep. 5, 2014

(65) Prior Publication Data

US 2015/0123701 A1    May 7, 2015

Related U.S. Application Data

(60) Provisional application No. 61/898,589, filed on Nov. 1, 2013.

(51) Int. Cl.
| | |
|---|---|
| *H03K 19/195* | (2006.01) |
| *H01L 49/00* | (2006.01) |
| *H01L 29/16* | (2006.01) |
| *H01L 29/20* | (2006.01) |
| *H01L 29/88* | (2006.01) |
| *H01L 29/06* | (2006.01) |

(52) U.S. Cl.
CPC .......... *H01L 49/006* (2013.01); *H01L 29/0669* (2013.01); *H01L 29/1606* (2013.01); *H01L 29/20* (2013.01); *H01L 29/88* (2013.01)

(58) Field of Classification Search
CPC .................... H01L 31/035209; B82Y 10/00
USPC ........................................... 326/5–7
See application file for complete search history.

(56) References Cited

U.S. PATENT DOCUMENTS

| | | | |
|---|---|---|---|
| 4,713,562 | A | 12/1987 | Hasuo et al. |
| 5,130,766 | A | 7/1992 | Arimoto et al. |
| 5,406,094 | A | 4/1995 | Arimoto et al. |
| 5,497,015 | A | 3/1996 | Ishibashi et al. |
| 7,566,897 | B2 | 7/2009 | Bibilashvili et al. |
| 7,786,472 | B2 | 8/2010 | Stafford et al. |
| 7,978,006 | B2 | 7/2011 | Shin et al. |
| 8,188,460 | B2 | 5/2012 | Banerjee et al. |
| 8,389,948 | B2 | 3/2013 | Arman et al. |
| 2004/0075464 | A1 | 4/2004 | Samuelson et al. |
| 2006/0273245 | A1* | 12/2006 | Kim et al. ............. 250/226 |

(Continued)

FOREIGN PATENT DOCUMENTS

| | | |
|---|---|---|
| EP | 0 381 591 A2 | 8/1990 |
| EP | 0 493 258 B1 | 7/1992 |

OTHER PUBLICATIONS

Bjork et al. "Nanowire resonant tunneling diodes", *Applied Physics Letters*, vol. 81, No. 23, Dec. 2, 2002, 4458-460.

*Primary Examiner* — Don Le
(74) *Attorney, Agent, or Firm* — Myers Bigel Sibley & Sajovec, P.A.

(57) ABSTRACT

A logic device is provided which includes an electron monochromator. The electron monochromator includes a quantum dot disposed between first and second tunneling barriers, an emitter coupled to the first tunneling barrier, and a collector coupled to the second tunneling barrier. The logic device also includes a quantum interference device. The quantum interference device includes a source which is coupled to the collector of the electron monochromator.

24 Claims, 3 Drawing Sheets

(56) References Cited

U.S. PATENT DOCUMENTS

| | | | |
|---|---|---|---|
| 2007/0201523 A1* | 8/2007 | Walter et al. | 372/43.01 |
| 2010/0315018 A1* | 12/2010 | Then et al. | 315/291 |
| 2011/0277829 A1* | 11/2011 | Fafard et al. | 136/255 |
| 2015/0014632 A1* | 1/2015 | Kim | 257/24 |

* cited by examiner

QUANTUM INTERFERENCE BASED LOGIC DEVICES INCLUDING ELECTRON MONOCHROMATOR

CROSS-REFERENCE TO RELATED APPLICATION

This application claims priority under 35 U.S.C. §120 to U.S. Provisional Application Ser. No. 61/898,589, entitled ELECTRON CHROMATOR FOR ROOM-TEMPERATURE OPERATION OF QUANTUM-INTERFERENCE COMBINATORIAL LOGIC, filed in the USPTO on Nov. 1, 2013, the disclosure of which is incorporated herein by reference in its entirety.

FIELD

The present inventive concept relates to quantum interference devices and, more particularly, to quantum interference devices providing combinatorial logic.

BACKGROUND

Quantum Interference Devices (QIDs) may be used as an alternative to thermionically-injected FETs as a means of implementing low-power, high-performance combinatorial logic. The principle of operation of a QID is analogous to the optical Mach-Zender interferometer. For example, a QID may operate by splitting an electron wave into two arms and rejoining these arms at the output. The wavelength of the electrons in one or both of the arms may be modulated by a gate electrode. By modulating the wavelengths, constructive or destructive interference can be achieved at the output. For optimal interference, the energy of electrons entering the QID should be uniform.

Quantum interference devices are also discussed, for example, in U.S. Pat. No. 5,130,766, U.S. Pat. No. 5,497,015, U.S. Pat. No. 7,786,472, European Patent Publication EP0381591, and European Patent Publication EP0493258.

SUMMARY

According to some embodiments of the inventive concept, there is provided a logic device. The logic device may include an electron monochromator. The electron monochromator may include a quantum dot disposed between first and second tunneling barriers, an emitter coupled to the first tunneling barrier, and a collector coupled to the second tunneling barrier. The logic device may include a quantum interference device. The quantum interference device may include a source which is coupled to the collector of the electron monochromator.

The size of the quantum dot may be constrained in more than one dimension sufficient to provide a single bound state. The size of the quantum dot may be constrained in all dimensions sufficient to provide a single bound state.

The electron monochromator may include a nanowire structure.

The electron monochromator and the quantum interference device may include semiconductor materials. The electron monochromator may include a vertical III-V resonant tunneling diode. The semiconductor material of the electron monochromator may be lattice matched to the semiconductor material of the quantum interference device. The quantum dot and quantum interference device may each include InAs and the tunneling barriers may include AlSb. The quantum dot and quantum interference device may each include InSb. The tunneling barriers may include CdTe. The emitter, quantum dot, collector, and quantum interference device may each include a first semiconductor material. The first and second barriers may each include a second semiconductor material. The electron monochromator and the quantum interference device may each include high mobility semiconductor materials. A scattering length of the high mobility semiconductor material of the electron monochromator may be equal to or longer than a length of the quantum interference device.

The electron monochromator may include a graphene ribbon. The first and second barriers may include gaps etched out of the graphene ribbon. The quantum dot may include an island of graphene between the gaps. The quantum interference device may include graphene ribbons.

According to some embodiments of the inventive concept, there is provided a logic device. The logic device may include an electron monochromator. The electron monochromator may include a quantum dot disposed between two tunneling barriers. The electron monochromator may be configured to receive a forward bias voltage and provide a narrow band electron current. The logic device may include a quantum interference device configured to receive the narrow band electron current and provide a logic output which is based upon one or more logic inputs.

The forward bias voltage may produce an input current through the electron monochromator. A propagation electron distribution of the current may be restricted to a reduced range of energy levels to provide the narrow band electron output current. In some embodiments, the propagation electron distribution of the input current is reduced to within about 5 meV. In some embodiments, the propagation electron distribution of the input current is reduced to within about 1 meV.

The size of the quantum dot may be constrained in more than one spatial dimension sufficient to provide a single bound state. The size of the quantum dot may be constrained in all spatial dimensions sufficient to provide a single bound state.

The electron monochromator may provide a narrow band electron current at temperatures at or above 70° F.

The quantum interference device may provide the logic output by splitting the narrow band electron current into a plurality of current paths, selectively modulating one or more of the plurality of current paths based on the one or more logic inputs, and recombining the plurality of current paths to achieve constructive or deconstructive interference. The quantum interference device may be set into a state of low resistance based on constructive interference or a state of high resistance based on destructive interference.

The quantum interference device may provide a full combinatorial logic block.

BRIEF DESCRIPTION OF THE FIGURES

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION

Figure 1:
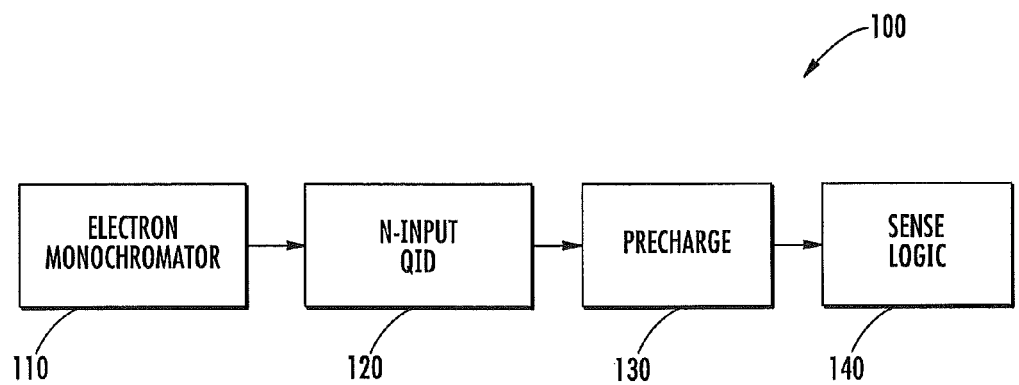
FIG. 1 is a block diagram schematically illustrating a logic device according to some embodiments of the inventive concept.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Exemplary embodiments of aspects of the present inventive concept explained and illustrated herein include their complementary counterparts.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

A Quantum Interference Device (QID) may be set into a state of low or high resistance, depending on a set of logic inputs. High resistance may result from destructive interference set up by the different interferometer arms of the QID, whereas low resistance may result from at least some of the paths through the QID resulting in constructive interference. In order to achieve optimal interference, the energy of electrons entering the QID should be uniform. As appreciated by inventors, in some embodiments of the inventive concept, an electron monochromator comprising a quantum dot double barrier resonant tunneling device may restrict the propagating electron distribution to a narrow range of wavelengths. Accordingly, the narrow range of wavelengths may provide a uniform energy for the electrons entering the QID in some embodiments of the inventive concept.

FIG. 1 is a block diagram schematically illustrating a logic device according to some embodiments of the inventive concept. Referring to FIG. 1, a combinatorial logic block 100 may include an electron monochromator 110, a QID 120, a pre-charge circuit 130, and sense circuit 140. The electron monochromator 110 may provide an electron wave having wavelengths much smaller than the overall length of the QID. The electron monochromator 110 may provide an electron wave having wavelengths in a narrow range, so as to be nearly monochromatic. For example, in some embodiments, the electron monochromator 110 may provide an electron wave with a wavelength of about 3 nm, which may correspond to an energy of about 100 meV above the Fermi level, for a QID of approximately 20 nm in length. In some embodiments, the electron monochromator 110 may provide an electron wave with the wavelength in a range between about 2.98 nm and about 3.02 nm.

The electron wave may propagate through the QID 120 which may provide constructive or destructive interference based on a number of logic inputs to provide an output electron wave. The pre-charge circuit 130 may prepare an input node for the sense circuit 140. The sense logic 140 may measure a voltage level of the input node to determine a logic output based on whether the QID has provided constructive or destructive interference based on the logic inputs.

Figure 2:
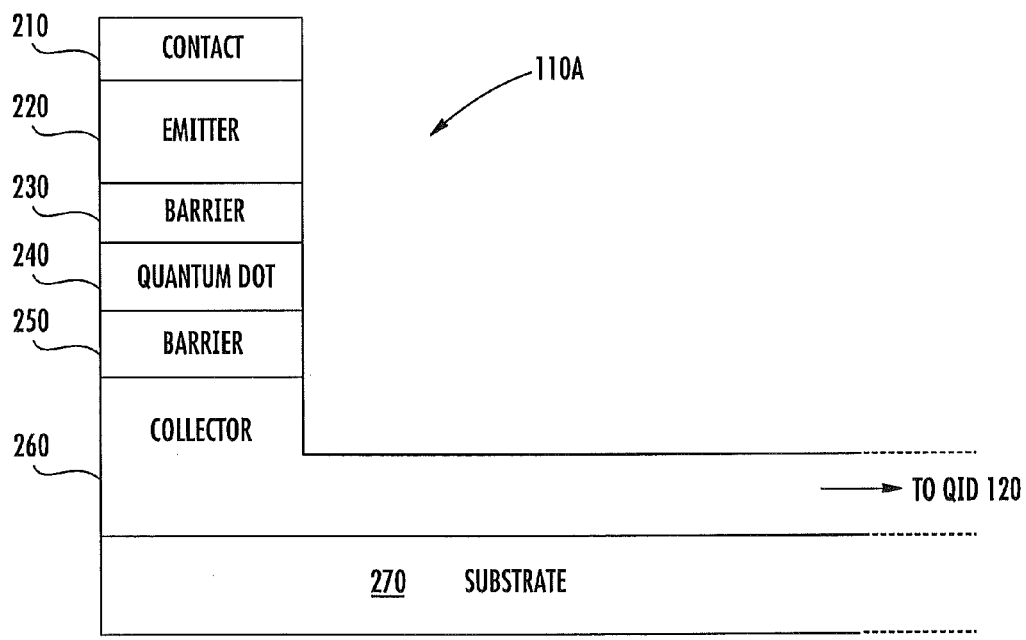
FIG. 2 is a cross sectional view schematically illustrating an electron monochromator shown in FIG. 1, according to some embodiments of the inventive concept.

FIG. 2 is a cross sectional view schematically illustrating an electron monochromator shown in FIG. 1, according to some embodiments of the inventive concept. Referring to FIG. 2, an electron monochromator 110A may comprise a quantum dot double barrier resonant tunneling device. The resonant tunneling device may comprise a quantum dot 240 disposed between a first barrier 230 and a second barrier 250. An emitter region 220 may electrically connect the first barrier 230 to a contact 210. The contact 210 may be electrically connected to a ground or lower voltage potential. A collector region 260 may electrically connect the second barrier 250 to source of the QID 120.

The resonant tunneling device may comprise semiconductor materials which may be disposed on a semiconductor substrate 270. For example, the resonant tunneling device may comprise a III-V resonant tunneling device. In other words, the resonant tunneling device may comprise III-V semiconductor materials. More specifically, the emitter, 220, quantum dot 240, and collector 260 may comprise InAs and the tunneling barriers 230 and 250 may comprise AlSb. Alternatively, in some embodiments of the inventive concept, the resonant tunneling device may comprise III-V and II-VI semiconductor materials. For example, the emitter, 220, quantum dot 240, and collector 260 may comprise InSb and the tunneling barriers 230 and 250 may comprise CdTe. The QID 120 may comprise the semiconductor material of the collector 260. The semiconductor materials of the resonant tunneling device may be lattice matched to the semiconductor material of the QID 120. The semiconductor materials may comprise high-mobility materials. For example, a scattering length of the high-mobility materials may be at least about a length of the QID 120. The length of the QID 120 may be the length of a path that an electron would travel to traverse the QID 120. The length may include a length to connect from the electron monochromator 110 to the QID 120.

The resonant tunneling device may comprise a vertical resonant tunneling device. For example, the resonant tunneling device may comprise a nanowire structure. Alternating narrow layers of semiconductor materials may be disposed on the semiconductor substrate 270 to form the resonant tunneling device. The barriers 230 and 250 may have respective thicknesses which are relatively small compared to the thicknesses of the emitter 220 and collector 260. The propagating electron distribution may be configured by the thickness of the tunneling barriers. Thicker barriers may produce a narrower distribution but may also restrict the total current through the resonant tunneling device. Thinner barriers may allow a higher total current through the resonant tunneling device but produce a broader distribution. The thicknesses of the barriers 230 and 250 may be relatively thin in order to allow a higher current of electrons to tunnel through but may be thick enough to permit a broadening of the bound state energy levels. The thicknesses of the barriers 230 and 250 may be optimized based on the semiconductor materials of the resonant tunneling device.

A layer of metal may be disposed on the alternating layers of semiconductor to form the contact 210. A width of the nanowire may be much smaller than the length of the nanowire. The width of the nanowire may be selected to form a width of the quantum dot 240.

The size of the quantum dot 240 may be constrained in more than one dimension. For example, the size of the quantum dot may be constrained in all three spatial dimensions. In other words, the size of the quantum dot may be constrained in length, width, and height. The size of the quantum dot 240 may be small enough to constrain electrons within the quantum dot 240 into a single or nearly single bound state.

For example, in some embodiments of the inventive concept, the size of the quantum dot 240 may be about 3 nm in all spatial dimensions. The barriers may have respective thicknesses of about 3 nm. An overall length of the nanowire may be much less than scattering mean free path. For example, an overall length of the nanowire may about 10 nm or less.

Figure 3:
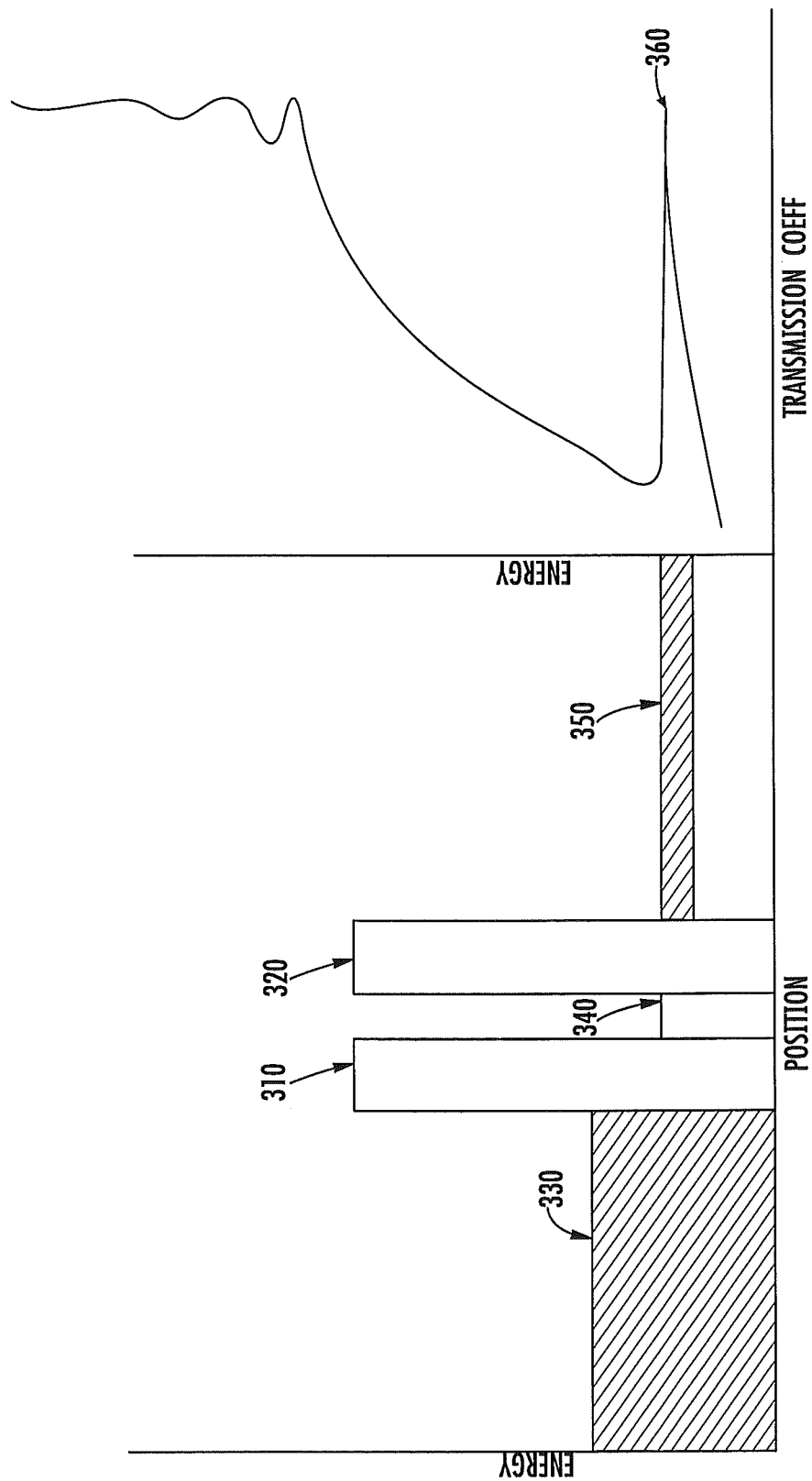
FIG. 3A is a graph illustrating a relation between an energy of an electron and position within the electron monochromator shown in FIG. 1, according to some embodiments of the inventive concept.
FIG. 3B is a graph illustrating a relation between an energy of an electron and a transmission coefficient of the electron monochromator shown in FIG. 1, according to some embodiments of the inventive concept.

FIG. 3A is a graph illustrating a relation between an energy of an electron and position within the electron monochromator shown in FIG. 1, according to some embodiments of the inventive concept. Referring to FIG. 3A, a first electron distribution 330 illustrates an energy probability distribution of electrons within the emitter 220 when a small forward bias voltage is present across the resonant tunneling device. Tunneling barrier levels 310 and 320 represent an ability of barriers 230 and 250 to block electrons below a particular energy level, as shown. Barriers 230 and 250 may be thin enough, however, to allow quantum tunneling to occur. Therefore, some electrons may tunnel through first barrier 230 into the quantum dot 240. Second electron distribution 340 illustrates that electrons may exist in the quantum dot 240 within a single bound state. Some electrons with the quantum dot single bound state may tunnel through the second barrier 250 and into the collector 260. Third electron distribution 350 illustrates an energy probability distribution of electrons within the collector 260. Since the electrons in the quantum dot may exist in a single bound state, the electrons within the collector may be constrained to a reduced energy range.

FIG. 3B is a graph illustrating a relation between an energy of an electron and a transmission coefficient of the electron monochromator shown in FIG. 1, according to some embodiments of the inventive concept. Referring to FIG. 3B, the resonant tunneling device may provide a lesser transmission coefficient for electrons above and below the level 360 of the bound state. The transmission coefficient may be greater at higher energy levels as electrons may have enough energy to traverse the barriers 230 and 250. Applying the first electron distribution 330 to the relation illustrated in FIG. 3B, the energy probability distribution of electrons within the emitter 220, as illustrated by first electron distribution 330, may not approach the effective barrier levels 310 and 320. Therefore, when a small forward bias voltage is present across the resonant tunneling device, the electron monochromator 110 may provide a narrow band electron current when a small forward bias voltage is applied. The narrow band electron current may be constrained to a reduced range. The narrow band electron current may be nearly monochromatic. For example, in some embodiments of the inventive concept, the narrow band electron current may be constrained to an electron wave having wavelengths in a range between 2.98 nm and 3.02 nm so as to be nearly monochromatic.

Figure 4:
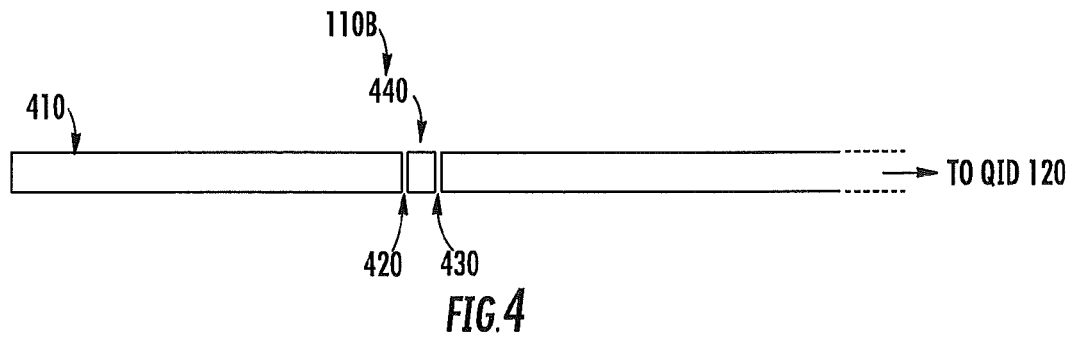
FIG. 4 is a plan view schematically illustrating an electron monochromator shown in FIG. 1, according to some embodiments of the inventive concept.

FIG. 4 is a plan view schematically illustrating an electron monochromator shown in FIG. 1, according to other embodiments of the inventive concept. Referring to FIG. 4, an electron monochromator 110B may comprise graphene. For example, the electron monochromator 110B may comprise graphene nanoribbons. The electron monochromator 110B may comprise a quantum dot double barrier resonant tunneling device. The resonant tunneling device may comprise a quantum dot 440 disposed between a first barrier 420 and a second barrier 430. An emitter region 410 may electrically connect the first barrier 420 to a contact which may be electrically connected to a ground potential. A collector region may electrically connect the second barrier 430 to source of the QID 120. The QID 120 may also comprise graphene nanoribbons. The barriers 420 and 430 may comprise splits etched in the graphene nanoribbon. The quantum dot 440 may comprise a small island of graphene defined by the barriers 420 and 430. The size of the quantum dot may be constrained in all spatial dimensions sufficient to contain electrons in a single bound state. For example, the width of the graphene nanoribbon may be narrow. The barriers 420 and 430 may be formed close together to define a small length of the quantum dot. The thickness of the graphene nanoribbon may be thin.

For example, in some embodiments of the inventive concept, the width of the graphene nanoribbon may be about 5 nm. The barriers 420 and 430 may have respective widths of about 3 nm in a dimension perpendicular to the width of the graphene nanoribbon. The length of the quantum dot may be about 3 nm. The thickness of the graphene nanoribbon may be a single monolayer.

Figure 5:
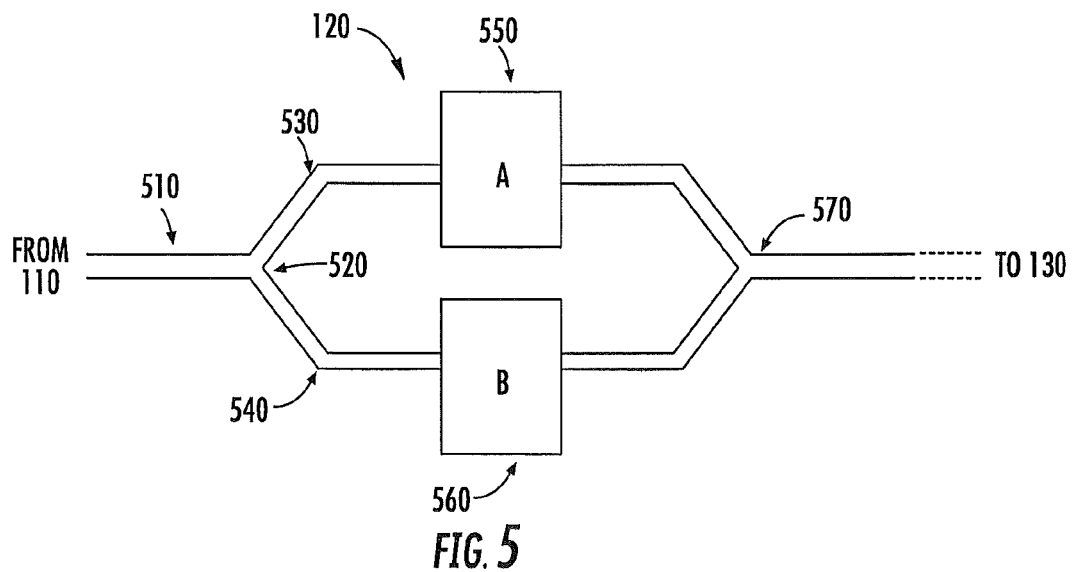
FIG. 5 is a block diagram schematically illustrating a quantum interference device shown in FIG. 1, according to some embodiments of the inventive concept.

FIG. 5 is a block diagram schematically illustrating a quantum interference device shown in FIG. 1, according to some embodiments of the inventive concept. Referring to FIG. 5, an input current may be received at a source 510. The input current may traverse to a split 520 wherein the input current is split into two currents which may traverse separate paths 530 and 540, sometimes referred to as arms. Gate electrodes 550 and/or 560 may modulate the phase of electrons in the respective ones of the two split currents. The gate electrodes 550 and 560 may modulate the phase of electrons based on logic inputs A and B. The gate electrodes 550 and 560 may be operated by applying a gate voltage. Gate voltages may be, for example, about 100 mV for a logic high level. The gate electrodes 550 and 560 may modulate the phase of electrons. The paths of the two split currents combine into a combined output current at a merger point 570. The current paths 530 and 540 may be of equal length from the split 520 to the merger point 570. Therefore, based on the relative phase modulation of the two currents, the combined current may be increased or reduced by constructive or destructive interference, respectfully. Thus, the operation of the QID 120 may be analogous to an operation of an optical Mach-Zender interferometer. The QID 120 may comprise additional splits, gate electrodes, and/or merger points to implement more complex logical functions. Thus QID 120 may implement a complex tree of combinatorial logic.

Figure 6:
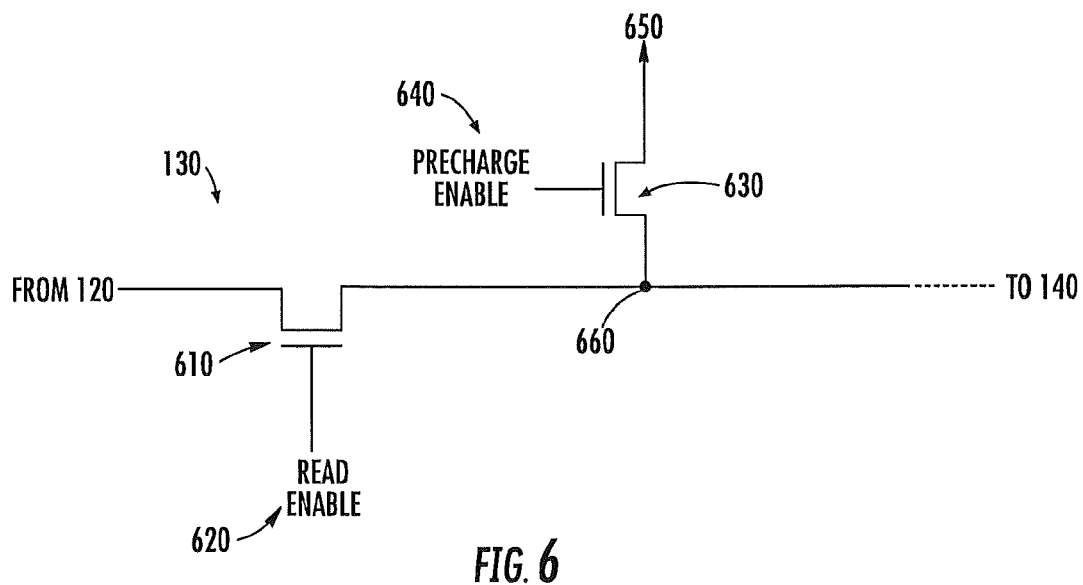
FIG. 6 is a schematic block diagram illustrating a precharge circuit shown in FIG. 1, according to some embodiments of the inventive concept.

FIG. 6 is a schematic block diagram illustrating a pre-charge circuit shown in FIG. 1, according to some embodiments of the inventive concept. Referring to FIG. 6, a node 660 may be electrically coupled to sense logic 140. A pre-charge enable transistor 630 may be configured to connect a pre-charge voltage source 650 to the node 660 based on a Pre-Charge Enable signal 640. A read enable transistor 610 may be configured to connect the output of the QID 120 to the node 660 based on a Read Enable signal 620. The pre-charge enable transistor 630 and the read enable transistor 610 may comprise CMOS transistors.

The sense logic 140 may be a voltage sense circuit comprising CMOS transistors. The sense logic 140 may detect a voltage level of the node 660 to determine an output logic level. The output logic level may be based on a function of the logic inputs.

The pre-charge circuit 130 may control an operation of the combinatorial logic block 100. For example, a Pre-Charge Enable signal 640 may control a pre-charge enable transistor 630 to connect a node 660 to a pre-charge voltage level. The pre-charge voltage level used may be lower than a standard CMOS voltage level. For example, the pre-charge voltage may be, for example, about 100 mV. Input voltages may be applied to the logic inputs of the QID 120. The Read Enable signal 620 may control the read enable transistor 610 to connect the node to the output of the QID 120. Since the output of the QID 120 is electrically connected to the collector 260 of the electron monochromator 110 through the QID 120, the pre-charged voltage level of the node 660 may present a forward bias voltage across the resonant tunneling device, which may create a current flow discharging the pre-charged voltage level of the node 660. The rate of discharge may depend on the state of the QID 120. For example, if the state is such that destructive interference occurs, the discharge rate may be slower than if the state permits constructive interference. After an amount of time, the Read Enable signal 620 may be disabled to prevent further discharge. Afterwards, the node 660 may store a voltage level that is higher or lower depending on the state of the QID 120. The sense logic 140 may sense the stored voltage level. A threshold of the sense logic 140 may be set between the expected voltage level remaining when the state of the QID 120 permits destructive interference and the expected voltage level remaining when the state of the QID 120 permits constructive interference.

In some embodiments of the inventive concept, the sense logic 140 may be a current sense circuit instead of a voltage sense circuit. The current sense circuit may be configured to sense the output current of the QID 120. In these embodiments, the combinatorial logic block may not comprise a pre-charge circuit. Instead, a voltage may be applied across the QID 120. Based on whether the state of the QID 120 permits constructive or destructive interference, the current sense circuit may detect a difference in the current flowing through the QID 120 to determine an output logic level.

As appreciated by the inventors, some QID devices will not operate above very low temperatures. However, the quantum dot electron monochromator 110 may provide a nearly monochromatic electron distribution without requiring cooling. In some embodiments according to the inventive concept, the combinatorial logic block 100 may operate in a temperature of 400K or less. Therefore, the combinatorial logic block 100 may operate at room temperature of about 70° F.

The QID 120 may have a lower capacitance than an equivalent CMOS combinatorial logic block. Additionally, the gate electrodes 550 and 560 may operate at a lower voltage than equivalent CMOS inputs. Therefore, the logic state of the combinatorial logic block 100 may be established in a shorter time than an equivalent CMOS combinatorial logic block. An evaluation time for the combinatorial logic block 100 may be dominated by a time required by the sense logic 140. However, the evaluation time for the combinatorial logic block 100 may be largely independent of the complexity of the logical function. Large combinatorial blocks which may traditionally require multi-stage CMOS transistor logic may be evaluated with a single QID 120. The larger the combinatorial block, the better the improvement may be provided by the QID 120.

While the inventive concept has been described with reference to some embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A logic device, comprising:
    an electron monochromator comprising a quantum dot disposed between first and second tunneling barriers, an emitter coupled to the first tunneling barrier, and a collector coupled to the second tunneling barrier; and
    a quantum interference device comprising a source which is coupled to the collector of the electron monochromator.

2. The logic device of claim 1, wherein the size of the quantum dot is constrained in more than one dimension sufficient to provide a single bound state.

3. The logic device of claim 1, wherein the size of the quantum dot is constrained in all dimensions sufficient to provide a single bound state.

4. The logic device of claim 1, wherein the electron monochromator comprises a nanowire structure.

5. The logic device of claim 1, wherein the electron monochromator and the quantum interference device comprise semiconductor materials.

6. The logic device of claim 5, wherein the electron monochromator comprises a vertical III-V resonant tunneling diode.

7. The logic device of claim 5, wherein the semiconductor material of the electron monochromator is lattice matched to the semiconductor material of the quantum interference device.

8. The logic device of claim 5, wherein the quantum dot and quantum interference device comprise InAs and the tunneling barriers comprise AlSb.

9. The logic device of claim 5, wherein the quantum dot and quantum interference device comprise InSb and the tunneling barriers comprise CdTe.

10. The logic device of claim 5, wherein the emitter, quantum dot, collector, and quantum interference device comprise a first semiconductor material and the first and second barriers comprise a second semiconductor material.

11. The logic device of claim 5, wherein the electron monochromator and the quantum interference device comprise high mobility semiconductor materials.

12. The logic device of claim 11, wherein a scattering length of the high mobility semiconductor material of the electron monochromator is equal to or longer than a length of the quantum interference device.

13. The logic device of claim 1, wherein the electron monochromator comprises a graphene ribbon.

14. The logic device of claim 13, wherein the first and second barriers comprise gaps etched out of the graphene ribbon and the quantum dot comprises an island of graphene between the gaps.

15. The logic device of claim 13, wherein the quantum interference device comprises graphene ribbons.

16. A logic device, comprising:
    an electron monochromator comprising a quantum dot disposed between two tunneling barriers and configured to receive a forward bias voltage and provide a narrow band electron current; and
    a quantum interference device configured to receive the narrow band electron current and provide a logic output which is based upon one or more logic inputs.

17. The logic device of claim 16, wherein the forward bias voltage produces an input current through the electron monochromator and a propagation electron distribution of the current is restricted to a reduced range of energy levels to provide the narrow band electron output current.

18. The logic device of claim 17, wherein the propagation electron distribution of the input current is reduced to within 5 meV.

19. The logic device of claim 16, wherein the size of the quantum dot is constrained in more than one spatial dimension sufficient to provide a single bound state.

20. The logic device of claim 16, wherein the size of the quantum dot is constrained in all spatial dimensions sufficient to provide a single bound state.

21. The logic device of claim 16, wherein the electron monochromator provides a narrow band electron current at temperatures at or above 70° F.

22. The logic device of claim 16, wherein the quantum interference device provides the logic output by splitting the narrow band electron current into a plurality of current paths, selectively modulating one or more of the plurality of current paths based on the one or more logic inputs, and recombining the plurality of current paths to achieve constructive or destructive interference.

23. The logic device of claim 22, wherein the quantum interference device is set into a state of low resistance based on constructive interference or a state of high resistance based on destructive interference.

24. The logic device of claim 16, wherein the quantum interference device provides a full combinatorial logic block.

* * * * *